(12) United States Patent
Chin et al.

(10) Patent No.: US 11,116,082 B2
(45) Date of Patent: Sep. 7, 2021

(54) INSULATION PROTECTION STRUCTURE

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Hung-Chieh Chin, Shenzhen (CN); Po-Lin Chen, Shenzhen (CN); Hung Chien Lee, Shenzhen (CN); Feng Ju Li, Shenzhen (CN); Dong-Sheng Xie, Shenzhen (CN); Gang Wu, Shenzhen (CN)

(73) Assignees: Interface Technology (Chengdu) Co., Ltd., Chengdu (CN); Interface Optoelectronics (Shenzhen) Co., Ltd., Shenzhen (CN); General Interface Solution Limited, Miaoli County (TW)

( * ) Notice: Subject to any disclaimer, the term of this patent is extended or adjusted under 35 U.S.C. 154(b) by 105 days.

(21) Appl. No.: 16/686,748

(22) Filed: Nov. 18, 2019

(65) Prior Publication Data
US 2021/0112665 A1  Apr. 15, 2021

(30) Foreign Application Priority Data
Oct. 10, 2019 (CN) .......................... 201910958692.3

(51) Int. Cl.
*H05K 1/18* (2006.01)
*H05K 1/02* (2006.01)
*H05K 1/05* (2006.01)

(52) U.S. Cl.
CPC ............. *H05K 1/185* (2013.01); *H05K 1/028* (2013.01); *H05K 1/05* (2013.01); *H05K 1/189* (2013.01); *H05K 2201/0162* (2013.01)

(58) Field of Classification Search
CPC .......... H05K 1/185; H05K 1/028; H05K 1/05; H05K 2201/162; H05K 2201/0162;
(Continued)

(56) References Cited

U.S. PATENT DOCUMENTS

2013/0329350 A1* 12/2013 Sato ........................ G06F 3/041
361/679.21
2014/0078701 A1* 3/2014 Tanabe .................... G06F 3/041
361/760
(Continued)

*Primary Examiner* — Roshn K Varghese
(74) *Attorney, Agent, or Firm* — Rosenberg, Klein & Lee

(57) ABSTRACT

An improved insulation protection structure comprises a sensor film, a chip outline, a protective film, and an insulating cement layer. The chip outline is on the sensor film, the protective film is on the chip outline, the insulating cement layer is between the chip outline and the protective film. The insulating cement layer comprises at least one surface facing inward the chip outline, retracted toward the direction of the chip outline and forms a retracted region along at least one side of the sensor film. Area of the proposed retracted region is preferably no more than 20% of that of the total insulating cement layer, and the conventional issues such as sulphide corrosion are solved. The proposed insulating cement layer can be cured merely at room temperature, and widely used for adhesive materials including both a gel and film, thus characterized by wider application range and better industrial applicability.

11 Claims, 7 Drawing Sheets

(58) Field of Classification Search
CPC . H05K 2201/09872; H05K 2201/0989; H05K 2201/10151; H05K 2201/0195; H05K 3/305; H05K 2203/0594; H01L 21/56; H01L 23/49861; H01L 2223/54486; H01L 2924/181; G06F 3/041–04186; B32B 27/08; B32B 7/12; B32B 3/04; B32B 2457/08; C09J 2203/326; Y10T 428/19–24777
USPC .......................................................... 156/87
See application file for complete search history.

(56) References Cited

U.S. PATENT DOCUMENTS

2016/0111485 A1\* 4/2016 Chida ................. H01L 27/3276
 257/40
2017/0148702 A1\* 5/2017 Funayama ............ G06F 3/0412

\* cited by examiner

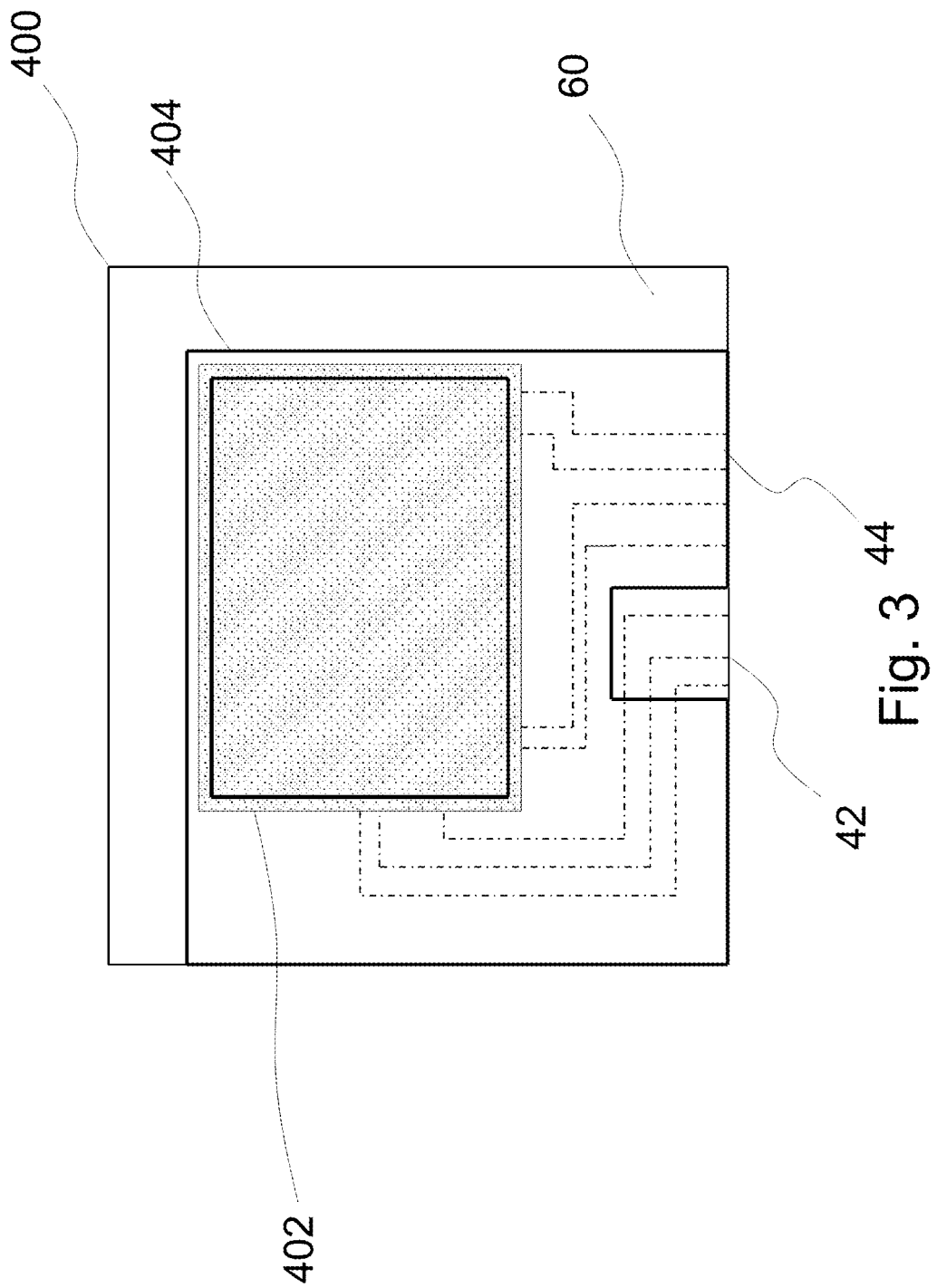

INSULATION PROTECTION STRUCTURE

This application claims priority for Chinese (P.R.C.) patent application no. 201910958692.3 filed on Oct. 10, 2019, the content of which is incorporated by reference in its entirely.

BACKGROUND OF THE INVENTION

Field of the Invention

The present invention is related to an insulation structure, and more particularly to an improved insulation protection structure, in which at least one surface of the insulation structure is retracting inward the direction of its chip outline so as to form at least one retracted region along with its periphery.

Description of the Prior Art

In general, a sensor is a kind of device that can sense the changes of an external signal and convert it into an applicable output signal based on a specific rule. It generally comprises a sensing element, a conversion element and so on. For example, a touch sensor device is able to receive the stimulus of the input signal of a contact object (including fingers or plastic pen of a user, etc.) and use its sensing element to sense the changes of exterior pressure, thermal energy or infrared light to generate the corresponding output signals. However, when taking the Toppan MMF sensor for an example, since its internal adhesive materials cannot be cured and carried out through the conventional high-temperature and high-pressure environments in the packaging process, but only through a low-temperature ultraviolet curing condition, bubbles between the adhesive materials and the carrier or wafer substrate are generated due to the bonding process, and may cause a lot of cavities within the bonding materials, which greatly affect the reliability, quality, and even function of the final product.

Please refer to FIG. 1 as the explication example. In FIG. 1, a generally conventional touch sensor device is shown, which includes a layer of insulating glue 14 which is printed on the signal trace layer 12 of the sensing substrate 10. The insulating glue 14 is disposed for the purpose of protecting the signal trace layer 12, preventing the signal trace layer 12 from being exposed in the subsequent processes and causing damage or loss in signals. However, it is worth noticing that, since the conventional insulating glue 14 is most likely to be manufactured by a screen printing process, as shown in FIG. 1, its surface roughness would be severe, and the edge of the insulating glue 14 would be aligned with the edge of the sensing substrate 10. As such, when the process protective film 16 is subsequently applied, it may not be evenly adhered upon the insulating glue 14, and causes a plurality of voids 22 and bubbles easily generated between the insulating glue 14 and the process protective film 16. Because of the voids 22 and the bubbles being formed, the corrosive contaminants 20 in the air may easily intrude, attack and vulcanize the metal lines and traces in the sensor device along the voids 22 and the bubbles. The vulcanization results are shown as FIG. 2A and FIG. 2B, in which FIG. 2A shows a vulcanization result diagram of the metal line circuit by using an optical microscope while FIG. 2B shows the vulcanization result diagram by using a scanning electron microscope. From these two figures, it is obvious that the corrosive contaminants 20 in the air attack and vulcanize the metal lines and traces in the conventional sensor device along the voids 22 easily in view of the traditional insulating glue configuration as shown in FIG. 1, and thus results in horrible vulcanization and corrosion of the metal line circuits.

Therefore, based on the prior arts as discussed above, it should be apparent and obvious that there is indeed an urgent need for the professionals in the field for a novel and inventive modified insulation protection structure to be developed that can effectively solve those above mentioned problems occurring in the prior design.

SUMMARY OF THE INVENTION

In order to overcome the above mentioned disadvantages of the prior arts, one major objective in accordance with the present invention is provided for a novel and improved insulation protection structure, which is aimed to modify the existing adhesive material layouts nowadays. Compared to the prior arts, the insulation protection structure disclosed by the present invention is beneficial to provide better quality of metal line circuit and enhance the process yield of the circuit as well.

Another objective in accordance with the present invention is provided for an improved insulation protection structure, in which at least one surface of the insulating cement layer is faced and retracted inwardly so as to form a retracted region along at least one side of the sensor film. As such, a protective film applied in the subsequent process where the vulcanization and corrosion usually occurred in the prior design scheme can be evenly adhered upon to the sensor film owing to the currently improved structure. And therefore, the shortcomings including vulcanization and corrosion of the metal line which have existed for a long time in the prior designs are significantly solved.

And yet another objective in accordance with the present invention is provided for an improved insulation protection structure, wherein the proposed insulating cement layer can be cured merely at room temperature to effectively form on the chip outline without using the conventional high temperature, high pressure or vacuum environment conditions. As a result, the process cost and complexity of the back-end process are reduced efficiently. And the proposed structure can be also widely applied to the field of the adhesive materials including both an adhesive gel and a film, and thus the invention is believed to be characterized by a wider application range and better industrial applicability.

For achieving the above mentioned objectives, the present invention provides an improved insulation protection structure, which comprises a sensor film, a chip outline, a protective film, and an insulating cement layer. The chip outline is configured on the sensor film, and the protective film covers on top of the chip outline so that the insulating cement layer is disposed between the chip outline and the protective film. At least one surface of the insulating cement layer is facing inward the chip outline, retracted toward a direction of the chip outline and forms a retracted region along at least one side of the sensor film.

According to one embodiment of the present invention, the insulating cement layer is formed adjacent to the at least one side of the sensor film, and is not aligned with the edge of the sensor film. Thus, the area of the retracted region is controlled to be less than 20% of that of the total insulating cement layer.

In one embodiment, the proposed insulating cement layer can be cured merely at room temperature, in a heated environment, or under ultraviolet light so as to form upon the chip outline. For example, material of the proposed insulating cement layer can alternatively be resin or silicone.

According to a preferred embodiment of the present invention, a first pitch is formed between an edge of the insulating cement layer and the at least one side of the sensor film. And, the width of the first pitch is greater than 0.3 mm. Also, the insulating cement layer further has a thickness, and the thickness is less than 15 mm.

Moreover, according to the embodiment of the present invention, the proposed chip outline further comprises a mesh region, a trace region and a T-bar region. The T-bar region is electrically connected between the mesh region and the trace region, such that a third pitch is formed between an inner edge of the insulating cement layer and the T-bar region. The width of the third pitch, preferably, is less than 0.1 mm.

Meanwhile, a fourth pitch is formed between an outer edge of the insulating cement layer and the trace region. And the width of the fourth pitch, preferably, is less than 0.1 mm.

Moreover, according to the embodiment of the present invention, the chip outline is able to be further electrically connected to a flexible printed circuit board (FPC), so the at least one side of the sensor film where the proposed retracted region is formed, is configured in an area other than a bonding area of the flexible printed circuit board.

In another aspect, according to a different embodiment of the present invention, the insulating cement layer disclosed by the invention may alternatively comprise a plurality of surfaces facing and retracting at the same time inward to the direction of the chip outline. As a result, in view of the multiple retracting surfaces, the present invention is able to provide an improved insulation protection structure having four retracted surfaces.

Alternatively, the insulating cement layer disclosed by the invention may also comprise merely single one surface facing and retracting inward to the direction of the chip outline, such that the improved insulation protection structure having single retracted surface is formed. The retracted surface, for instance, can be a left surface, a right surface, a front surface, or a rear surface of the insulating cement layer, which can all be used to implement for achieving the purposes of the present invention, without limiting the claim scope thereof.

By employing the proposed design scheme, the improved insulation protection structure disclosed by the present invention provides at least one surface facing and retracting inward to the direction of the chip outline, such that a retracted region at its periphery is formed. Owing to the disclosed novel retracted region, the protective film applied in the subsequent process, where the vulcanization as well as corrosion were easily generated, on the contrary, can be evenly adhered upon to the sensor film, thereby solving the shortcomings such as vulcanization and corrosion of the metal line which have existed for a long time in the prior designs, and improving the quality and product yield of the metal line circuit.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 3 shows a schematic structural upper view of an improved insulation protection structure in accordance with an embodiment of the present invention.

DESCRIPTION OF THE PREFERRED EMBODIMENTS

Figure 1:
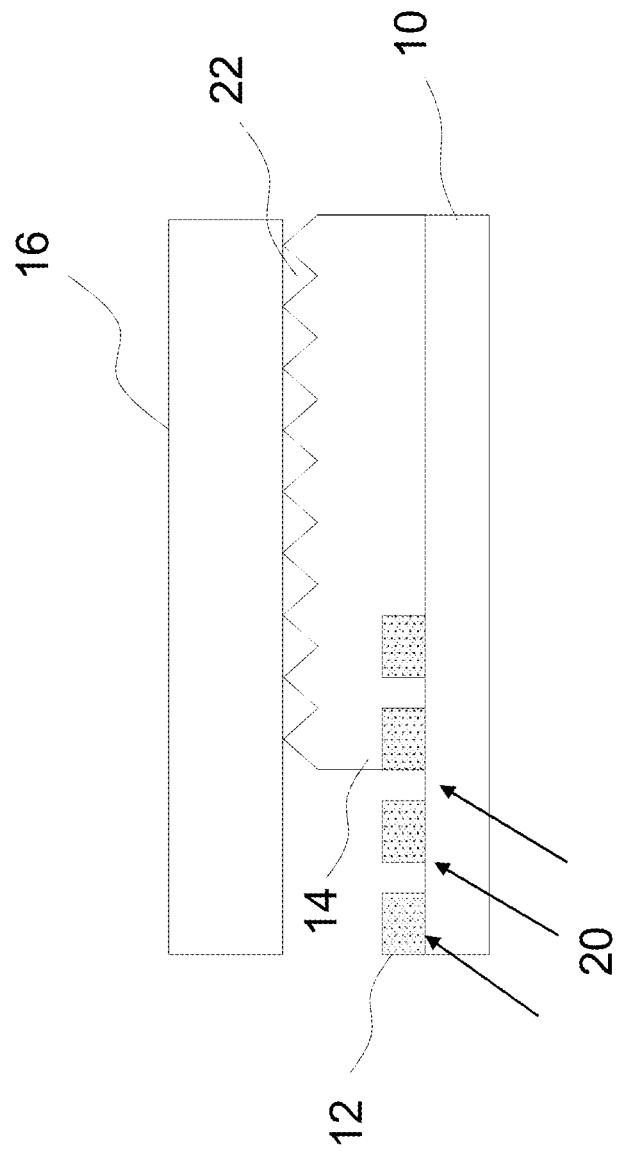
FIG. 1 shows a cross sectional view of a conventional touch sensor structure in the prior art.
Figure 2A:
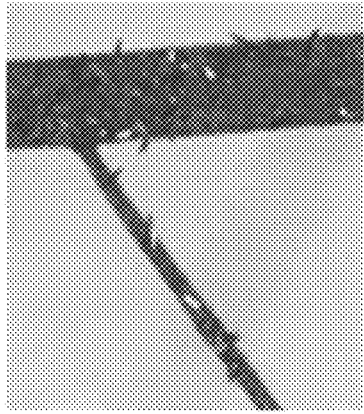
FIG. 2A shows a result diagram of the metal line circuit in the structure as shown in FIG. 1 by using an optical microscope.
Figure 2B:
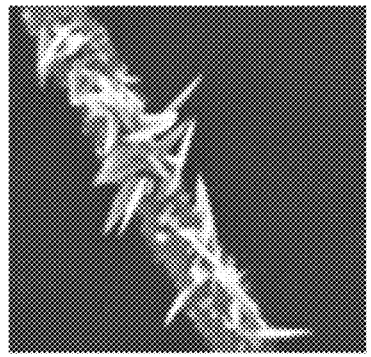
FIG. 2B shows a result diagram of the metal line circuit in the structure as shown in FIG. 1 by using a scanning electron microscope.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 4:
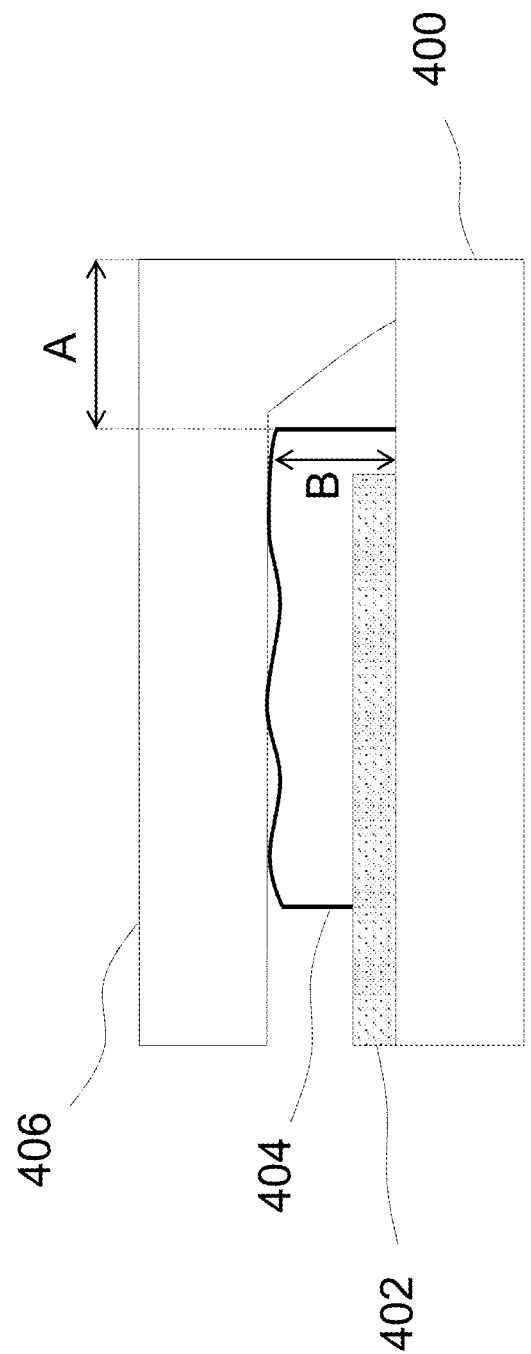
FIG. 4 shows a schematic structural view of FIG. 3 which is covered with a process protective film.

In order to solve the above mentioned problems occurring in the prior design that corrosive contaminants in the air are usually able to break into the structure along a gap between the traditional insulating glue and the protective film easily, attacking and vulcanizing the metal circuit, and resulting in a terrible vulcanization and corrosion of the metal line, the present invention is aimed to propose a novel solution, which provides an improved insulation protection structure. In order to have a better understanding of the technical contents of the present invention, please refer to FIG. 3 and FIG. 4 at the same time for a detailed description in the following paragraph, wherein FIG. 3 shows a schematic structural upper view of an improved insulation protection structure in accordance with an embodiment of the present invention, and FIG. 4 shows a schematic structural view of FIG. 3 which is covered with a process protective film.

According to an embodiment of the present invention, the improved insulation protection structure mainly comprises a sensor film 400, a chip outline 402, a protective film 406, and an insulating cement layer 404. The sensor film 400 is a sensing substrate and comprises a transmitting circuit area (TX) 42 and a receiving circuit area (RX) 44. In the figure of the present invention, as shown by the dotted region, is the chip outline 402, which is configured on the sensor film 400. The protective film 406 covers on top of the chip outline 402 and the insulating cement layer 404, such that the insulating cement layer 404 is disposed between the chip outline 402 and the protective film 406. In the figure of the present invention, as shown by the thick solid line, defines the region of the insulating cement layer 404. In one embodiment of the present invention, the insulating cement layer 404, for example, can be made of resin or silicone, and can be cured merely at room temperature, in a heated environment, or under ultraviolet light so as to form upon the chip outline 402.

In particular, please refer to FIG. 3. It is evident that the proposed insulating cement layer 404 of the present invention forms a non-full structure at its periphery. That is to say, the insulating cement layer 404 is formed adjacent to at least one side of the sensor film 400, and is not aligned with the edge of the sensor film 400. In a preferred embodiment of the present invention, the insulating cement layer 404 comprises at least one surface facing inward the chip outline 402, retracted toward a direction of the chip outline 402 and forms a retracted region 60 along at least one side of the sensor film 400.

According to the preferred embodiment of the present invention, it is sophistically designed an area of the retracted region 60, so as to control the area of the retracted region 60 as no more than 20% of that of the total insulating cement layer 404.

Furthermore, according to the embodiment of the present invention, the chip outline 402 is able to be further electrically connected to a flexible printed circuit board (FPC), so the at least one side of the sensor film 400 where the retracted region 60 is formed, is configured in an area other than a bonding area of the flexible printed circuit board.

In the following, the present invention provides more detailed implementations regarding the size limitation and correspondingly relative position of the insulating cement layer which can be implemented according to the present invention. Please refer to FIG. 4 and FIG. 5 at the same time, wherein FIG. 4 discloses a schematic diagram showing the thickness of the insulating cement layer and the relative displacement between the insulating cement layer and the sensor film in accordance with the embodiment of the present invention, and FIG. 5 discloses another relative displacement between the insulating cement layer with respect to the chip outline in accordance with a preferred embodiment of the present invention.

In view of these, please refer to FIG. 4 first, in which a first pitch A is formed between an edge of the insulating cement layer 404 and the side of the sensor film 400 where the retracted region faces toward. A width of the first pitch A is greater than 0.3 mm. And thus, the above mentioned retracted region 60 can be effectively formed along the side of the sensor film 400.

Moreover, in the embodiment of the present invention, the insulating cement layer 404 further has a thickness B, and the thickness B is less than 15 mm.

Figure 5:
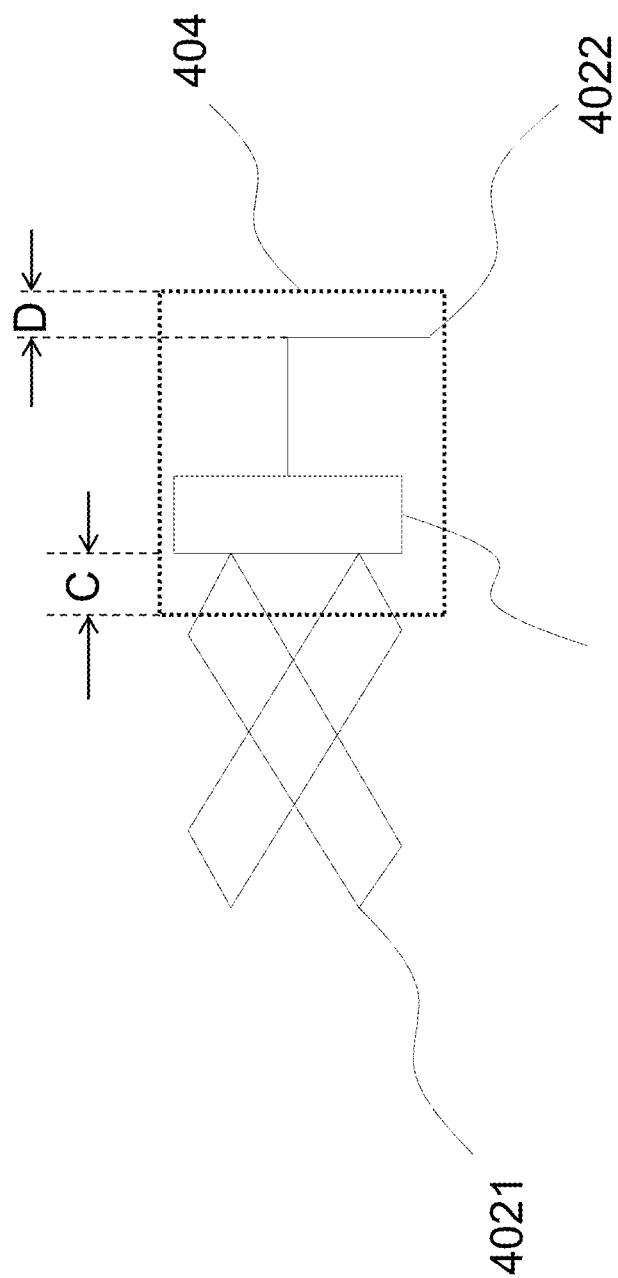
FIG. 5 shows a schematic diagram of relative displacement between the insulating cement layer with respect to the chip outline in accordance with a preferred embodiment of the present invention.

Later on, please refer to FIG. 5 then. According to the embodiment of the present invention, the proposed chip outline 402 further comprises a mesh region 4021, a trace region 4022 and a T-bar region 4023. The T-bar region 4023 is electrically connected between the mesh region 4021 and the trace region 4022, such that a third pitch C is formed between an inner edge of the insulating cement layer 404 and the T-bar region 4023, and a fourth pitch D is formed between an outer edge of the insulating cement layer 404 and the trace region 4022.

In a preferred embodiment of the present invention, a width of the third pitch C is less than 0.1 mm, and the width of the fourth pitch D is less than 0.1 mm, as disclosed herein by the present invention.

Figure 6:
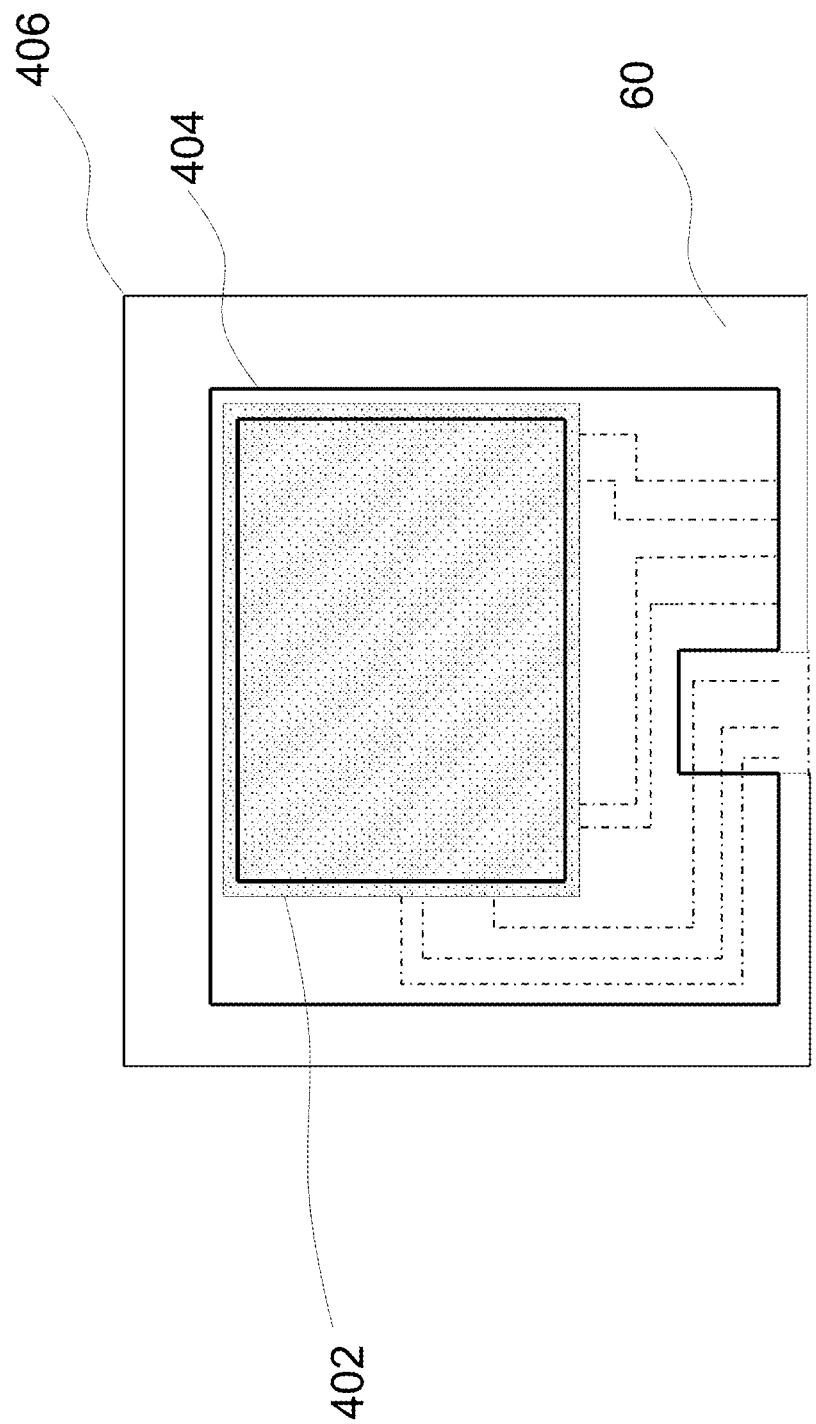
FIG. 6 shows a schematic structural view of an improved insulation protection structure having four retracted surfaces in accordance with another embodiment of the present invention.

Furthermore, it draws our attention that the present invention is definitely not limited to the above mentioned embodiment which has been disclosed in FIG. 3. Please refer to FIG. 6, which shows another schematic structural upper view of an improved insulation protection structure in accordance with another embodiment of the present invention. In FIG. 6, the improved insulation protection structure comprises four surfaces facing and retracted inward the direction of the chip outline to form the retracted region. As shown, the insulating cement layer 404 of the present invention may comprise a plurality of the surface facing inward the chip outline 402, and all of the surfaces retract toward the direction of the chip outline 402 so as to form the improved insulation protection structure having four retracted surfaces as indicated by FIG. 6.

Figure 7:
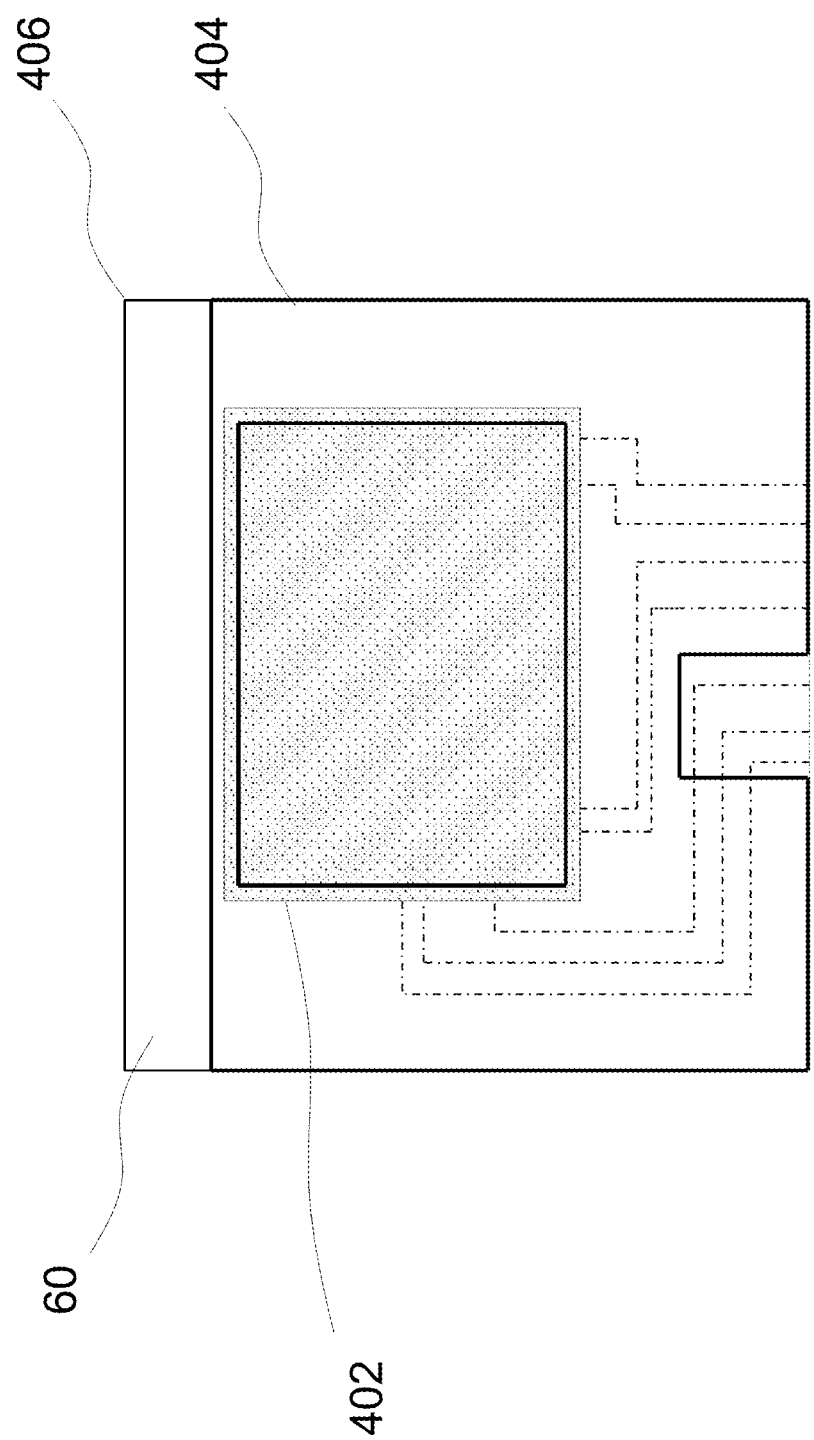
FIG. 7 shows a schematic structural view of an improved insulation protection structure having single retracted surface in accordance with yet another embodiment of the present invention.

By employing a similar manner, FIG. 7 shows yet another embodiment of the present invention, in which the improved insulation protection structure having only one retracted surface as indicated by FIG. 7 is implemented. In such embodiment, merely a rear surface of the insulating cement layer 404 is retracted toward the direction of the chip outline 402 so as to form an improved insulation protection structure having single retracted surface. Nevertheless, according to a variety of embodiments of the present invention, the retracted surface may alternatively be a front surface, a left surface or a right surface of the insulating cement layer 404. Those who are skilled in the art and have ordinary knowledge will be able to design their own retracted patterns according to the practical actual requirements and process specifications, and the present invention is surely not limited to the above mentioned embodiments which have been disclosed herein. The explanatory embodiments disclosed in the foregoing paragraphs are merely provided for the purpose of explaining the main technical features of the present invention, such that people skilled in the art can understand and implement the technical contents of the present invention. However, the present invention is not limited thereto.

In view of the above, as compared with the prior arts, it is apparent that the novel improved insulation protection structure disclosed by the present invention is able to effectively solve the shortcomings such as vulcanization and corrosion of the metal line which have existed for a long time in the prior designs. By employing the present invention, it is accomplished that not only the quality of the metal line circuit and the process yield of the circuit can be greatly and efficiently improved, but also a protective film applied in the subsequent process can be evenly and uniformly adhered upon to the sensor film. According to the technical contents of the present invention, by retracting inward at least one surface of the insulating cement layer such that the retracted region can be formed along at least one side or even a plurality of sides of the sensor film, the present invention is advantageous of having optimized design of size limitation and relative configuration of the proposed insulating cement layer to be implemented.

In addition, according to the improved insulation protection structure disclosed by the present invention, the proposed structure can also be widely applied to the field of the adhesive materials including both an adhesive gel and a film, and thus the invention is believed to be characterized by a wider application range and better industrial applicability.

Therefore, to sum up, it is believed that the present invention is instinct, effective and highly competitive for recent technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An improved insulation protection structure, comprising:
   a sensor film;
   a chip outline, configured on said sensor film;
   a protective film, covering on top of said chip outline; and
   an insulating cement layer, disposed between said chip outline and said protective film, wherein said insulating cement layer comprises at least one surface facing inward said chip outline, retracted toward a direction of said chip outline and forms a retracted region along at least one side of said sensor film, wherein a first pitch is formed between an edge of said insulating cement layer and said at least one side of said sensor film, and a width of said first pitch is greater than 0.3 mm.

2. The improved insulation protection structure according to claim 1, wherein said insulating cement layer is made of resin or silicone.

3. The improved insulation protection structure according to claim 2, wherein said insulating cement layer is cured at room temperature, in a heated environment, or under ultraviolet light so as to form upon said chip outline.

4. The improved insulation protection structure according to claim 1, wherein said insulating cement layer is formed adjacent to said at least one side of said sensor film, and is not aligned with an edge of said sensor film.

5. The improved insulation protection structure according to claim 1, wherein an area of said retracted region is no more than 20% of that of said total insulating cement layer.

6. The improved insulation protection structure according to claim 1, wherein said insulating cement layer has a thickness, and said thickness is less than 15 mm.

7. The improved insulation protection structure according to claim 1, wherein said chip outline further comprises a mesh region, a trace region and a T-bar region, said T-bar region is electrically connected between said mesh region and said trace region, such that a third pitch is formed between an inner edge of said insulating cement layer and said T-bar region and a fourth pitch is formed between an outer edge of said insulating cement layer and said trace region.

8. The improved insulation protection structure according to claim 7, wherein a width of said third pitch is less than 0.1 mm.

9. The improved insulation protection structure according to claim 7, wherein a width of said fourth pitch is less than 0.1 mm.

10. The improved insulation protection structure according to claim 1, wherein said insulating cement layer comprises a plurality of said surface facing inward said chip outline, and all of said surfaces retract toward said direction of said chip outline to form said retracted region.

11. The improved insulation protection structure according to claim 1, wherein said chip outline is further electrically connected to a flexible printed circuit board, so said at least one side of said sensor film is configured in an area other than a bonding area of said flexible printed circuit board.

* * * * *